United States Patent [19]

Granberg et al.

[11] Patent Number: 4,639,760
[45] Date of Patent: Jan. 27, 1987

[54] HIGH POWER RF TRANSISTOR ASSEMBLY

[75] Inventors: Helge O. Granberg, Phoenix; Samuel L. Coffman, Scottsdale, both of Ariz.

[73] Assignee: Motorola, Inc., Schaumburg, Ill.

[21] Appl. No.: 820,773

[22] Filed: Jan. 21, 1986

[51] Int. Cl.$^4$ .................... H01L 25/04; H01L 23/14; H01L 23/02; H01L 23/06

[52] U.S. Cl. ........................... 357/75; 357/74; 357/80; 357/81

[58] Field of Search ................ 357/74, 75, 80, 81, 357/51

[56] References Cited

U.S. PATENT DOCUMENTS

| 4,038,677 | 7/1977 | Nagel et al. | 357/51 |
| 4,408,219 | 10/1983 | Resneau et al. | 357/75 |
| 4,518,982 | 5/1985 | Du Bois et al. | 357/81 |

FOREIGN PATENT DOCUMENTS

| 2806099 | 8/1978 | Fed. Rep. of Germany | 357/80 |
| 58-89852 | 5/1983 | Japan | 357/75 |
| 59-35456 | 2/1984 | Japan | 357/74 |

Primary Examiner—William D. Larkins
Assistant Examiner—John Lamont
Attorney, Agent, or Firm—Robert M. Handy

[57] ABSTRACT

An improved high frequency high power transistor assembly capable of delivering 600 watts or more at 100 MHz and higher without the need for water cooling is described. Four transistor die individually mounted on separate BeO ceramic isolators are installed in a recessed cavity in a copper base. The BeO isolators have metallized top surfaces which connect to the backside output contacts of the transistor die and extend toward the centerline of the cavity. They connect to a longitudinally arranged input-output assembly centrally located over the center line of the cavity. The input-output assembly has a wrap-around electrode structure which brings the transistor output connections to the upper surface of the assembly for easy bonding to the output leads. The input to the individual die is via individual ballast resistors mounted on the input-output assembly, one per transistor, to provide transistor-to-transistor matching for more uniform current distribution.

4 Claims, 4 Drawing Figures

HIGH POWER RF TRANSISTOR ASSEMBLY

BACKGROUND OF THE INVENTION

1. Field of the Invention

This invention relates in general to high frequency high power semiconductor devices and, more particularly, to high frequency high power transistor device assemblies having improved performance.

2. Background Art

High power high frequency semiconductor devices are widely used. In many circumstances it is essential that high power, i.e., in the range of several hundred watts, be provided at frequencies extending into the HF and VHF ranges (3–300 MHz) in a single device assembly. Most commonly, devices operating in these power and frequency ranges are fabricated from several semiconductor die operating electrically in parallel within a single housing or assembly.

In the prior art, devices capable of operating at power levels of approximately 500 watts at 2–30 MHz have been achieved. The type TH-20 transistor assembly manufacture by Thompson-CSF of Paris, France is a typical example. Higher power and higher frequency operation are much desired. Further, prior art devices have suffered from a number of limitations, in particular, poor thermal dissipation requiring the use of water cooled assemblies to carry away the heat, the use of large numbers of complex internal parts and the high cost thereof, the use of an excessive number of welded or solder internal connections which adversely affect the reliability of the unit, and the absence of chip-to-chip ballasting resistors to insure uniform current distribution in multi-chip designs. Thus, a need continues to exist for high frequency high power devices which will simultaneously achieve higher powers and higher operating frequencies, while avoiding water cooling and complex, expensive internal structures that need large numbers of welded or soldered connections, and which incorporate inter-chip ballasting resistors to equal chip currents.

Accordingly, it is an object of the present invention to provide an improved high power and high frequency semiconductor device assembly having power and frequency capabilities equal or greater than heretofor achieved.

It is an additional object of the present invention to provide an improved high power and high frequency device assembly in which the number of internal piece parts and the number of internal interconnections has been substantially reduced.

It is a further object of the present invention to provide an improved high frequency and high power device assembly in which the thermal performance is such as to eliminate the need for water cooling.

It is an additional object of the present invention to provide an improved high frequency and high power transistor assembly having a more compact internal arrangement so that lead length is minimized in order to achieve lower inductance.

It is a further object of the present invention to provide an improved high frequency and high power transistor assembly wherein the above advantages are achieved simultaneously.

As used herein the words "metal" or "metallic" are intended to refer to any highly electrically conductive material whether semiconductor, semimetal, intermetallic, or metal. The words "bond" or "bonding" are intended to refer to any metallurgical means for joining objects, including but not limited to soldering, eutectic bonding, brazing, or welding, and under circumstances where electrical conductivity is not required, the use of dielectric solders or adhesives such as but not limited solder glasses or epoxies. As used herein the words "wire bonds" are intended to refer to any form of interconnecting leads which extend in part above the surface to which they connect, whether round, flat, or tape mounted leads or incorporating bumps.

SUMMARY OF THE INVENTION

The attainment of the foregoing and other objects and advantages is achieved through the present invention wherein there is provided a high power high frequency transistor device, comprising: a metal base having a substantially flat bottomed recess therein; at least two insulating substrate isolators having metallized regions on their upper faces and mounted in the recess by their lower faces; at least two transistor die, smaller than the substrate isolators, each bonded to a first portion of the metallized region of one of the substrate isolators so to leave exposed a second portion of the metallized region, wherein the second portions of the metallized regions of the at least two substrate isolators are laterally adjacent to the centerline of the recess; and input-output connection means comprising an insulated base with substantially parallel upper and lower faces; wherein the input connection means has a first conductor region having a portion on the lower face bonded to the second portions of the metallized regions of the at least two substrate isolators and a portion on the upper face and an interconnecting portion therebetween; wherein input-output connection means has a second conductor region on the upper face separated from the first conductor region; and wherein the input-output connection means has third conductor regions on the upper face, one per transistor die, separated from the first and second conductor regions and electrically coupled to input leads of the transistor die; and wherein the input-output connection means has ballast resistor regions, one per transistor die, on the upper face connected between the second conductor region and the third conductor regions.

The metal base desirably forms the reference terminal of the device. Wide metal leads are mounted by insulating means on the metal base to form input and output connectons. Wire bonds are used to connect the input lead to the second conductor region on the upper face of the input-output connection means, and additional wire bonds are used to connect the output lead to the portion of the first conductor region lying on the upper face of the input-output connection means. Additional wire bonds are provided to connect the input contacts on the semiconductor die to the third conductor regions. The transistor die are desirably electrically connected in parallel. It is desirable that there be at least one ballast resistor region in series with each of the transistor die. Further wire bonds are provided to connect the reference terminals of the transistor die to the metal base. The output contact of each transistor die is located on the lower die surface and is bonded to the first portion of the metallized region of the substrate isolators. It is desirable that the flat bottom recess of the metal base have shoulders extending alongside the transistor die at a height substantially equal to the die surface to permit minimum length wire bonds connected to the reference contacts on the semiconductor transistor die. It is also desirable that the insulated external input and output leads on the metal base have upper surfaces at the perimeter of the recess which are substantially at the same elevation as the surface of the input-out connection means to permit minimum length wire bonds therebetween.

DETAILED DESCRIPTION OF THE DRAWINGS

For purposes of explanation, the transistor assembly illustrated herein is shown as containing four transistor die electrically connected in parallel and having four ballast resistors, one per transistor die, in series with the input. However, those of skill in the art will understand that the structure of the high frequency high power transistor assembly illustrated herein containing four such devices and four ballast resistors is presented as an aid to understanding and not intended to be limiting, and that other arrangements embodying the same principles and die larger than zero (e.g. 2, 4, 6, 8, could equally well be used and arranged according to the teachings of the present invention. The invention is particularly well suited to arrangements containing an even number of die, e.g. 2, 4, 6, 8, etc., but odd numbers of die greater than one could also be used.

Figure 1:
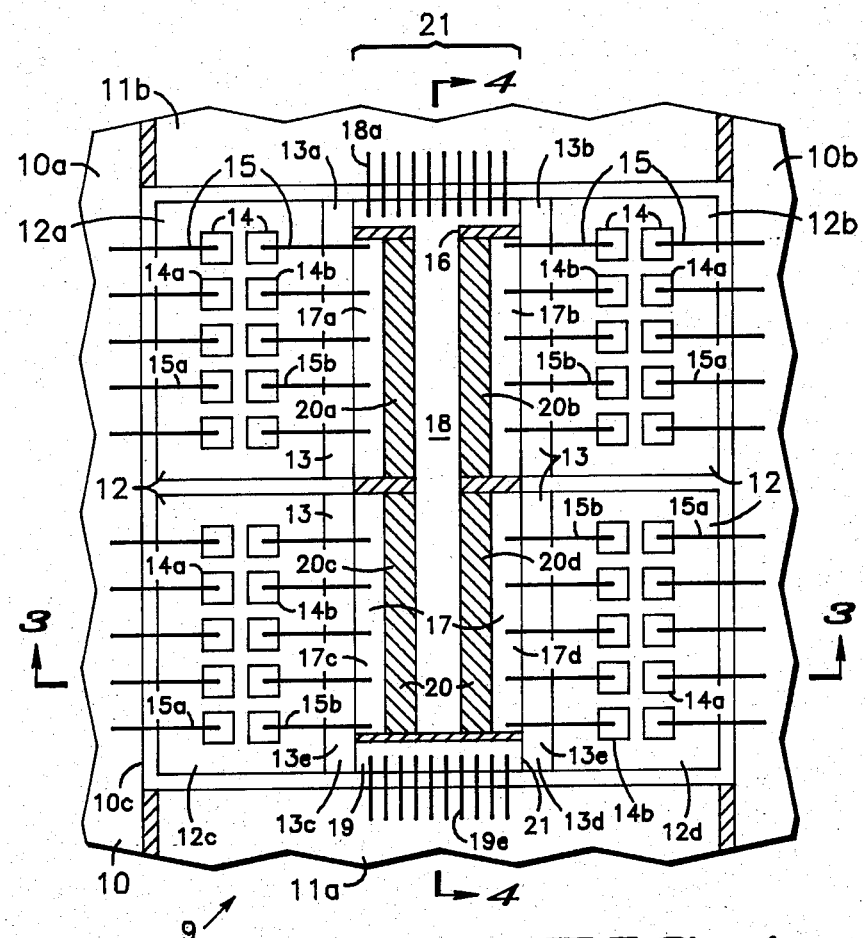
FIG. 1 shows a simplified plan view of a portion of a high frequency high power transistor assembly, according to the present invention, containing four transistor die.
Figure 3:
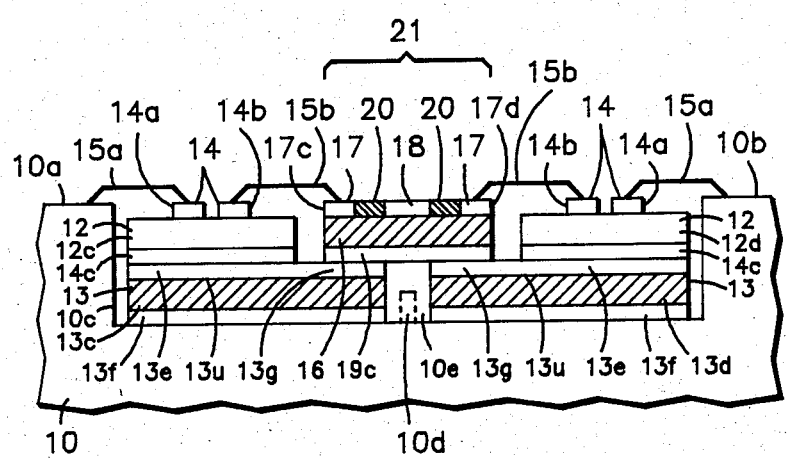
FIG. 3 is a cross-section in simplified schematic form of the assembly of FIG. 1.
Figure 2:
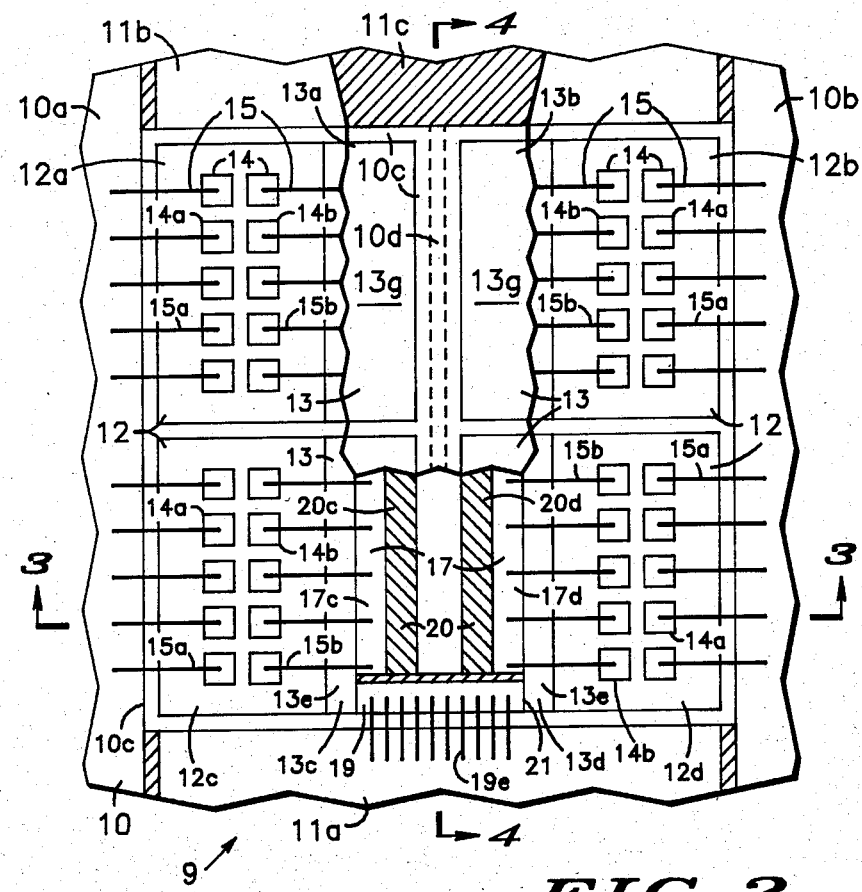
FIG. 2 shows the same structure as in FIG. 1 but with a portion of the device input assembly containing the ballast resistors removed to show underlying details.
Figure 4:
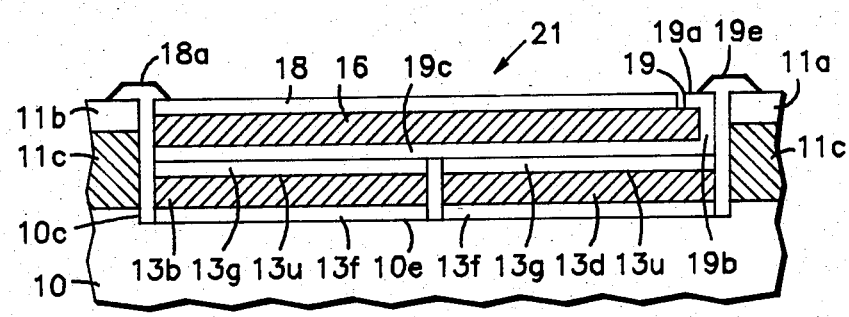
FIG. 4 is a cross-section in simplified schematic form of a further cross-section of the assembly of FIG. 1.

FIG. 1 shows in simplified and schematic form a plan view of portion 9 of a high frequency high power transistor assembly according to the present invention. The parts of the assembly external to portion 9 and not shown consist of the remainder of the package base, containing the mounting holes and the remaining length of the input and output leads. These are conventional. FIG. 2 shows the same view of the assembly as in FIG. 1 but with certain portions removed to show details of the underlying structure. FIGS. 3-4 show cross-sections in simplified and schematic form through various portions of the assembly of FIG. 1. The arrangement of parts making up the assembly of FIG. 1 is best understood by considering FIGS. 1-4 together.

Assembly portion 9 comprises metallic base or substrate 10 having recess 10c in which are mounted transistor die 12, ceramic isolators 13, and electrical input-output assembly 21 containing insulating piece or plate 16, metallization layers 17–19 and ballast resistors 20. Metal base 10 may be of any material which is highly conductive both electrically and thermally. Gold plated OFHC copper is a convenient material for base 10, but other highly conductive materials could be used. Aluminum is an example of such an alternate material. Bottom 10e of recess 10c is substantially flat, although ridge 10d along the centerline of the cavity may be optionally used for convenience in aligning the internal parts. Electrically insulating pieces 13 and 16 are desirably made of ceramic. Insulating pieces 13 should have the highest possible thermal conductivity. BeO is a suitable material for insulating pieces 13. Insulating piece or plate 16 may be conveniently fabricated from any electrically insulating material having good RF properties. $Al_2O_3$ is a suitable material.

Transistor die 12 have contacts 14 on their upper surface, wherein contacts 14a are the electrical reference contacts and contacts 14b are the input contacts. Transistor die 12 are of the type which have output contact 14c on their lower faces. Transistor die of this type are well known in the art and include but are not limited to, for example, bipolar transistors, MOS transistors, and thyristors. Two terminal devices may also be employed, and as used herein, the term "transistor" is intended to include any devices having one or more top surface contacts and a bottom surface output contact.

Transistor die 12 are mounted on individual dielectric isolators 13, that is, transistor die 12a is mounted on individual isolator 13a, transistor die 12b on individual isolator 13b, transistor die 12c on individual isolator 13c, and transistor die 12d on individual isolator 13d. It is important that each transistor die be mounted on a separate isolator and that the mounting means be thermally highly conductive. It has been found that when two or more die are placed on the same isolator, that thicker isolators must be used and the thermal performances significantly degraded.

As may be seen in FIG. 3, die 12 are mounted on the portion of isolators 13 which are adjacent to shoulders 10a–b of base 10. Die 12 are smaller than isolators 13. Thus, a portion of the upper surface of each isolator is not covered by die 12 and is available to support and to be bonded to input-output assembly 21. Input-output assembly 21 comprises insulating plate 16 having input conductor 18, ballast resistors 20, and metal contacts 17 on its upper surface. Ceramic plate 16 has output conductor 19 with portion 19c on its lower surface bonded to portions 13g of conductors 13e on the upper surfaces of insulators 13, portion 19b extending around one end of insulating plate 16 and portion 19a on the upper surface, i.e., the same surface as input conductor 18. Input conductor 18 is connected to input lead 11b via wire bonds 18a and output conductor 19 is connected to output lead 11a by wire bonds 19e. Leads 11a–b are mounted by insulating means 11c on base 10. For convenience in understanding the drawings, insulating plates 13, 16, and insulating means 11c supporting leads 11a–b are shown cross-hatched in FIGS. 1–4. Ballast resistors 20 are stippled.

Isolators 13 are bonded to metallic base 10 by means 13f. Means 13f must be a good thermal conductor but need not be electrically conducting. Upper surfaces 13u of isolators 13 are covered with conductor layer 13e, typically a thin film of, for example, evaporated metal, to which are bonded output contacts 14c of transistor die 12. Portions 13g of upper surface conductor layers 13e on each of the several isolators 13 extend under input assembly 21 and are bonded to conductor layer portion 19c of assembly 21. By virtue of the wrap-around construction of conductor 19 on assembly 21 (see FIG. 4) the output connections to all of transistor die 12 are brought to the top surface of assembly 21 so as to be available to be bonded to output lead 11a by minimum length wire bonds 19e.

Input-output assembly 21 provides for space efficient distribution of the input signal via input conductor 18 which extends centrally along cavity 10c of base 10 above the center line. Assembly 21 provides space for individual ballast resistor regions 20a–d, one each for each of transistor die 12a–d. Input conductor 18 is connected to input lead 11b via minimum length wire bonds 18a (see FIGS. 1 and 4). Ballast resistor regions 20a–d extend between input conductor 18 and contact regions 17, i.e. one each of ballast resistor regions 20a–d connected to contact regions 17a–d for each of transistor die 12a–d. Wire bonds 15 are used to make electrical contact to transistor die 12. Wire bonds 15b connect contacts 17 to input contacts 14b of transistor die 12, and wire bonds 15a connect reference contacts 14a of transistor die 12 to base 10 in shoulder regions 10a–b.

FIG. 2 is substantially similar to FIG. 1 except that the portion of electrical input-output assembly 21 at the top of the figure is cut away so that optional ridge 10d and portions 13g of metallization layers 13e on isolators 13a–b may be seen where they underly assembly 21.

A semiconductor device assembly conforming to the above described principles was constructed. Base 10 measures approximately 1 by 1.5 inches and has central cavity 10c approximately 0.625 inches square. Input lead 11b and output lead 11a are each approximately 0.5 inches in width. Isolators 13 are formed from BeO pieces approximately 0.275 inches square and 25 mils thick. Semiconductor transistor die measuring approximately 0.25 inches by 0.13 are mounted on the isolators as shown in FIGS. 1–4. Insulating piece 16 measures approximately 0.2 inches in width by approximately 0.55 inches in length and 0.025 inches in thickness and is formed from 96% alumina. Ballast resistors 17 exhibit resistances typically of 1–3 ohms each, but smaller or larger values can be used, including zero. Substrate or base 10 is approximately 0.2 inches thick. Cavity 10c is recessed approximately 0.06 inches into base 10. Isolators 13, chips 12, and input-output assembly 21 are bonded together and to base 10 using a combination of soldering and eutectic bonding techniques well known in the art. Commercially available Au-Sn and Pb-In-Ag solder materials and pre-forms are suitable.

A device assembly similar to that illustrated in FIGS. 1–4 and utilizing four N-channel enhancement mode RF field effect transistor die delivers 600 watts of output power at 30 MHz at a power gain of 16 db (typical) with an efficiency of about 45 percent. Power gain decreases within increasing frequency but is still approximately 7.5 db at a frequency of 100 MHz with a power output of 600 watts. Water cooling is not used. These results are obtained with base 10 mounted on an air cooled copper heat sink. This performance exceeds that available from prior art devices. As compared to prior art devices or assemblies, fewer piece parts and internal connections are required. Higher power levels can be obtined by adding more die. High frequency operation can be obtained by using transistor die with finer geometries and greater emitter periphery so as to have lower parasitic capacity and greater gain-bandwidth product.

Having thus described the invention, it is apparent that the present invention provides a transistor assembly having improved power dissipation capabilities and high frequency performance, which uses fewer piece parts and is compactly arranged so that minimum lead length and minimum inductance bonds may be used to the external conductors. Further the number of welded or solder connections is reduced. In addition, the advantages and objectives described herein are achieved simultaneously.

While the invented structure has been illustrated in terms of a device assembly utilizing four transistor die, those of skill in the art will recognize that this is merely intended to be illustrative, and that the invented method can be used in combination with any number of transistors and/or with other semiconductor die as well. Accordingly, it is intended to include all such variations within the claims which follow.

We claim:

1. A high power, high frequency transistor unit, comprising:
   an electrically and thermally conductive base plate having a centerline;
   at least two separate electrically insulating but thermally conducting isolators disposed in either side of said centerline, each having a first principal face bonded to said base plate and a second principal face opposite said first principal face, wherein said second principal face has thereon a first metal layer;
   at least two transistor die, each having a signal input contact, a reference contact, and a power output contact, wherein said signal input contact and said reference contact are on a first face of said transistor die and said power output contact is on an opposed second face of said transistor die, and wherein said at least two transistor die are disposed on said isolators, one per isolator, with said power output contact bonded to said first metal layer of said isolator;
   a ballasted electrical input-output assembly comprising a substantially flat electrically insulating plate having first and second opposed principal faces, wherein said insulating plate extends over and parallel to said centerline and portions of said at least two isolators and bridges between at least two of said at least two isolators located on either side of said centerline;
   wherein said insulating plate has on said first face a first metal region region forming an input lead for said assembly and at least two ballast resistor regions, one per transistor, each ballast resistor region being located between said input lead and a second metal region coupled to said input contact of one of said transistors;
   wherein said insulating plate has on said second face an output conductor electrically coupled to said output contacts of said transistors die by said first metal layers on said isolators, and wherein said output conductor extends around an edge of said insulating plate onto said first surface; and
   first wire bonds extending from said input lead to an external input lead of said assembly, second wire bonds extending from said output lead to an external output lead of said assembly, third wire bonds extending from said reference contacts of said transistor die to said substrate, and fourth wire bonds extending from said second metal regions on said insulating plate to said input contacts of said transistor die.

2. A high power, high frequency transistor device, comprising:
   a metal base having a substantially flat bottomed recess therein;
   at least two insulating substrate isolators having metallized regions on their upper faces and mounted in said recess by their lower faces;

at least two transistor die, smaller than said substrate isolators, each bonded to a first portion of said metallized region of one of said substrate isolators so as to leave exposed a second portion of said metallized region, wherein said second portions of said metallized regions of said at least two substrate isolators are laterally adjacent; and connection means comprising an insulating base with substantially parallel upper and lower faces, with a first conductor region having a portion on said lower face bonded to said second portions of said metallized regions of said substrate isolators and a portion on said upper face and an interconnecting portion therebetween, with a second conductor region on said upper face separated from said first conductor region, and with ballast resistor regions, one per transistor die on said first face connected to said second conductor region and coupled to said transistor die.

3. A high power semiconductor device assembly comprising:

a metal base having a substantially flat bottomed recess therein;

at least two insulating substrate isolators having metallized regions on their upper faces and mounted in said recess by their lower faces;

at least two semiconductor die, smaller than said substrate isolators, wherein an upper face of each die contains an input contact and a lower face of each die contains an output contact, and wherein said output contact is directly bonded to a first portion of said metallized region of one of said substrate isolators so as to leave exposed a second portion of said metallized region, and wherein said second portions of said metallized regions of said at least two substrate isolators are laterally adjacent; and connection means comprising an insulating base with substantially parallel upper and lower faces, with a first conductor region having a portion on said lower face bonded to said second portions of said metallized regions of said substrate isolators and a portion on said upper face and an interconnecting portion therebetween, and with a second conductor region on said upper face separated from said first conductor region and electrically coupled to said input contact of said die.

4. A high power semiconductor device assembly comprising:

a metal base having a substantially flat bottomed recess therein;

at least two insulating substrate isolators having metallized regions on their upper faces and mounted in said recess by their lower faces;

at least two semiconductor die, smaller than said substrate isolators, wherein an upper face of each die contains an input contact and a lower face of each die contains an output contact, and wherein said output contact is directly bonded to a first portion of said metallized region of one of said substrate isolators so as to leave exposed a second portion of said metallized region, and wherein said second portions of said metallized regions of said at least two substrate isolators are laterally adjacent; and connection means comprising an insulating base with substantially parallel upper and lower faces, with a first conductor region having a portion on said lower face bonded to said second portions of said metallized regions of said substrate isolators and a portion on said upper face and an interconnecting portion therebetween.

* * * * *